(12) United States Patent
Liu et al.

(10) Patent No.: US 11,088,180 B2
(45) Date of Patent: Aug. 10, 2021

(54) CONDUCTIVE WIRE STRUCTURE AND MANUFACTURING METHOD THEREOF, ARRAY SUBSTRATE AND DISPLAY DEVICE

(71) Applicants: HEFEI BOE OPTOELECTRONICS TECHNOLOGY CO., LTD., Anhui (CN); BOE TECHNOLOGY GROUP CO., LTD., Beijing (CN)

(72) Inventors: Tianzhen Liu, Beijing (CN); Xianxue Duan, Beijing (CN); Dezhi Xu, Beijing (CN)

(73) Assignees: Hefei BOE Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 112 days.

(21) Appl. No.: 16/512,664

(22) Filed: Jul. 16, 2019

(65) Prior Publication Data

US 2020/0152669 A1      May 14, 2020

(30) Foreign Application Priority Data

Nov. 14, 2018   (CN) .......................... 201811353181.0

(51) Int. Cl.
  *H01L 27/02*   (2006.01)
  *H01L 27/12*   (2006.01)
  *H01L 29/12*   (2006.01)

(52) U.S. Cl.
  CPC ...... *H01L 27/1248* (2013.01); *H01L 27/0248* (2013.01); *H01L 27/0251* (2013.01);
  (Continued)

(58) Field of Classification Search
  CPC ............. H01L 27/0296; H01L 27/0292; H01L 27/124; H01L 27/1244; H01L 27/0248;
  (Continued)

(56) References Cited

U.S. PATENT DOCUMENTS 9,673,225 B2 *  6/2017  Ma ........................... G09G 3/20
10,690,975 B2 *  6/2020  Okabe ............... G02F 1/136204
(Continued)

FOREIGN PATENT DOCUMENTS

CN      103035192 A  *  4/2013  ......... H01L 27/1222
CN      203616554 U  *  5/2014  ....... G02F 1/136204
(Continued)

OTHER PUBLICATIONS

VLSI Expert, Antenna Effects, VLSI Concepts, http://www.vlsi-expert.com/2008/07/, Jul. 19, 2008, 5 pages, date accessed Dec. 31, 2020 (Year: 2008).*

(Continued)

*Primary Examiner* — Earl N Taylor
(74) *Attorney, Agent, or Firm* — The Webb Law Firm

(57) ABSTRACT

The present disclosure provides a conductive wire structure, a manufacturing method thereof, an array substrate and a display device. The conductive wire structure includes a first conductive wire and a second conductive wire on a first plane, wherein a connection end of the first conductive wire is spaced apart from a connection end of the second conductive wire by a gap so as to discharge charges accumulated on the first conductive wire and the second conductive wire through the gap; an electrical connector connected to the connection end of the first conductive wire and the connection end of the second conductive wire, respectively, wherein a part of the electrical connector is located on a second plane different from the first plane.

12 Claims, 4 Drawing Sheets

(52) U.S. Cl.
CPC ...... *H01L 27/0296* (2013.01); *H01L 27/1259* (2013.01); *H01L 29/12* (2013.01)

(58) Field of Classification Search
CPC ............ H01L 27/1259; H01L 27/1248; G09G 2330/04; G09G 2310/0286
See application file for complete search history.

(56) References Cited

U.S. PATENT DOCUMENTS

| | | | | | |
|---|---|---|---|---|---|
| 10,825,807 | B2* | 11/2020 | Ren | ................... | H01L 23/5226 |
| 2002/0068388 | A1* | 6/2002 | Murakami | ............. | H01L 29/04 |
| | | | | | 438/149 |
| 2002/0101547 | A1* | 8/2002 | Lee | ................... | G02F 1/136204 |
| | | | | | 349/40 |
| 2005/0078232 | A1* | 4/2005 | Lo | ..................... | G02F 1/136204 |
| | | | | | 349/40 |
| 2005/0146648 | A1* | 7/2005 | Yang | ................... | G02F 1/1368 |
| | | | | | 349/42 |
| 2006/0092591 | A1* | 5/2006 | Yuan | .................. | H01L 27/0251 |
| | | | | | 361/91.1 |
| 2007/0287237 | A1* | 12/2007 | Rockenberger | ....... | H01L 29/458 |
| | | | | | 438/163 |
| 2014/0027769 | A1* | 1/2014 | Hara | ................... | H01L 29/7869 |
| | | | | | 257/43 |
| 2014/0175436 | A1* | 6/2014 | Yamazaki | ............ | H01L 27/1225 |
| | | | | | 257/43 |
| 2014/0306227 | A1* | 10/2014 | Yu | ....................... | H01L 27/0296 |
| | | | | | 257/72 |
| 2015/0092134 | A1* | 4/2015 | Jiang | ................... | G02F 1/1368 |
| | | | | | 349/46 |
| 2015/0262961 | A1* | 9/2015 | Jones | ..................... | H01L 24/48 |
| | | | | | 257/532 |
| 2017/0179166 | A1* | 6/2017 | Xiao | .................... | G02F 1/13454 |
| 2018/0130790 | A1* | 5/2018 | Park | ..................... | H01L 27/0266 |
| 2019/0067409 | A1* | 2/2019 | Shin | ..................... | H01L 27/0288 |
| 2019/0113813 | A1* | 4/2019 | Okabe | ............... | H01L 21/02274 |
| 2019/0302921 | A1* | 10/2019 | Chen | ....................... | G06F 3/044 |
| 2019/0305012 | A1* | 10/2019 | Yang | ....................... | G09G 3/20 |
| 2019/0319046 | A1* | 10/2019 | Tom In Aga | ..... | G02F 1/136204 |
| 2020/0064700 | A1* | 2/2020 | Cheng | ................. | H01L 27/0296 |
| 2020/0152669 | A1* | 5/2020 | Liu | ..................... | H01L 27/0296 |
| 2020/0411990 | A1* | 12/2020 | Nakamura | ............. | H01Q 21/06 |

FOREIGN PATENT DOCUMENTS

| | | | | | |
|---|---|---|---|---|---|
| CN | 104681581 | A | * | 6/2015 | ........... G02F 1/1345 |
| CN | 106783842 | A | * | 5/2017 | ........... H01L 27/124 |
| CN | 106876416 | A | * | 6/2017 | ....... G02F 1/136204 |
| CN | 107479757 | A | * | 12/2017 | ....... G02F 1/133512 |
| CN | 206710762 | U | * | 12/2017 | ......... H01L 27/1225 |
| CN | 107833883 | A | * | 3/2018 | ......... H01L 27/0288 |
| CN | 107894682 | A | * | 4/2018 | ....... G02F 1/136259 |
| CN | 207250516 | U | * | 4/2018 | |
| CN | 207925467 | U | * | 9/2018 | ....... G02F 1/133512 |
| CN | 109935583 | A | * | 6/2019 | ........... H01L 27/124 |
| CN | 110085584 | A | * | 8/2019 | |
| KR | 20130038175 | A | * | 4/2013 | ......... H01L 27/1225 |
| WO | WO-2017170219 | A1 | * | 10/2017 | ....... G02F 1/136227 |

OTHER PUBLICATIONS

First Office Action for CN Appl. No. 201811353181.0, dated Feb. 25, 2020.

* cited by examiner

```
      ┌─────────────────────────────────────┐
      │  form a first conductive wire and a second    │
      │   conductive wire on a first plane, wherein a │
      │ connection end of the first conductive wire is│──701
      │   spaced from a connection end of the second  │
      │   conductive wire by a gap, so as to discharge│
      │    charges accumulated on the first and second│
      │              conductive wires                 │
      └─────────────────────────────────────┘
                         │
                         ▼
      ┌─────────────────────────────────────┐
      │ form an electrical connector which is connected│
      │ with the connection end of first conductive wire│
      │  and the connection end of the second conductive│──702
      │     wire, respectively, wherein a part of the   │
      │ electrical connector is located on a second plane│
      │           different from the first plane        │
      └─────────────────────────────────────┘
```

FIG.7

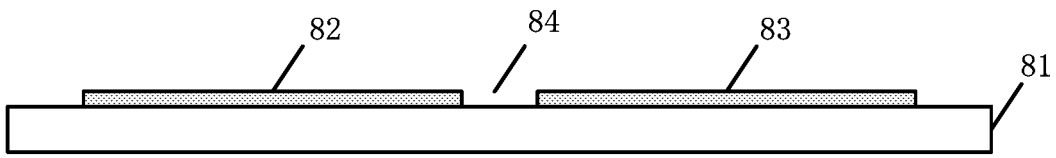

FIG.8A

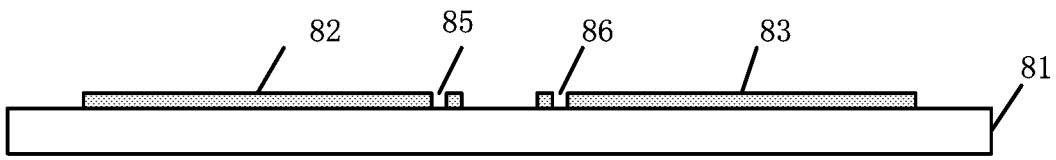

FIG.8B

CONDUCTIVE WIRE STRUCTURE AND MANUFACTURING METHOD THEREOF, ARRAY SUBSTRATE AND DISPLAY DEVICE

CROSS-REFERENCE TO RELATED APPLICATIONS

The present application claims priority to CN Application No. 201811353181.0, filed on Nov. 14, 2018, which is hereby incorporated in the present application in its entirety.

TECHNICAL FIELD

The present disclosure relates to the field of display technologies, and in particular, to a conductive wire structure, a method for manufacturing the same, an array substrate, and a display device.

BACKGROUND

In related art of TFT (Thin Film Transistor) devices, since a IGZO (Indium Gallium Zinc Oxide) has higher electron mobility and lower leakage current, the TFT manufactured using the IGZO can meet the requirements of higher performance and larger size driving circuits.

SUMMARY

According to a first aspect of an embodiment of the present disclosure, there is provided a conductive wire structure comprising: a first conductive wire and a second conductive wire on a first plane, wherein a connection end of the first conductive wire is spaced apart from a connection end of the second conductive wire by a gap so as to discharge charges accumulated on the first conductive wire and the second conductive wire through the gap; an electrical connector connected to the connection end of the first conductive wire and the connection end of the second conductive wire, respectively, wherein a part of the electrical connector is located on a second plane different from the first plane.

In some embodiments, a projection of an end face of the first conductive wire on a plane where an end face of the second conductive wire is located at least partially covers the end face of the second conductive wire.

In some embodiments, a width of the gap ranges from 5 to 10 μm.

In some embodiments, line widths of the first conductive wire and the second conductive wire are 5 to 10 μm.

In some embodiments, the first conductive wire and the second conductive wire are gate wire.

In some embodiments, the electrical connector comprises: a first connection portion, electrically connected with the connection end of the first conductive wire; a second connection portion, electrically connected with the connection end of the second conductive wire; a third connection portion, electrically connected to the first connection portion and the second connection portion.

In some embodiments, the third connection portion is located on the second plane.

According to a second aspect of the embodiment of the present disclosure, there is provided an array substrate including the conductive wire structure according to any of the aforementioned embodiments.

In some embodiments, the gap in the conductive wire structure is located in a display area.

In some embodiments, the array substrate further comprises a first gate electrically connected with the first conductive wire in the conductive wire structure; a second gate electrically connected with the second conductive wire in the conductive wire structure; and a third gate and a third conductive wire electrically connected with the third gate; wherein the first conductive wire, the second conductive wire, the third conductive wire, the first gate, the second gate and the third gate are all on a first plane; and wherein a width of the gap between the first conductive wire and the second conductive wire is smaller than a distance between the third conductive wire and the first gate or a distance between the third conductive wire and the second gate.

According to a third aspect of the embodiments of the present disclosure, there is provided a display device comprising the array substrate according to any of the above embodiments.

According to a fourth aspect of an embodiment of the present disclosure, there is provided a method of manufacturing a conductive wire structure including: forming a first conductive wire and a second conductive wire on a first plane, wherein a connection end of the first conductive wire is spaced apart from a connection end of the second conductive wire by a gap so as to release charges accumulated on the first conductive wire and the second conductive wire through the gap; forming an electrical connector connected to the connection end of the first conductive wire and the connection end of the second conductive wire, respectively, wherein a part of the electrical connector is located on a second plane different from the first plane.

In some embodiments, a projection of an end face of the first conductive wire on a plane where an end face of the second conductive wire is located at least partially covers the end face of the second conductive wire.

In some embodiments, a width of the gap ranges from 5 to 10 μm.

In some embodiments, line widths of the first conductive wire and the second conductive wire are 5 to 10 μm.

Further features of the present disclosure, as well as advantages thereof, will become clearer from the following detailed description of exemplary embodiments of the present disclosure with reference to the accompanying drawing.

BRIEF DESCRIPTION OF THE DRAWINGS

The accompanying drawings, which constitute a part of the specification, illustrate embodiments of the present disclosure and, together with the description, serve to explain the principles of the present disclosure.

The present disclosure may be understood more clearly from the following detailed description with reference to the accompanying drawings, wherein:

FIG. 7 is a flow chart illustrating a method for fabricating a conductive wire structure according to one embodiment of the present disclosure;

FIGS. 8A-8C are cross-sectional views of a structure at several stages in a method of fabricating a conductive wire structure according to some embodiments of the present disclosure.

Figure 1:
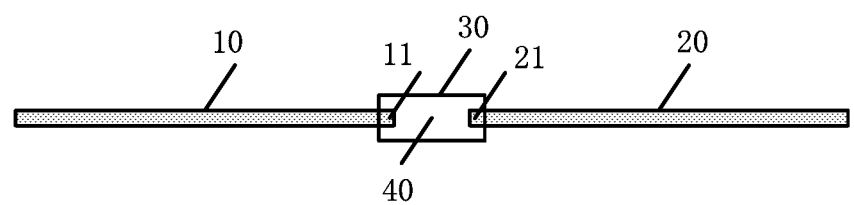
FIG. 1 is a schematic top view of a conductive wire structure according to one embodiment of the present disclosure.

It should be understood that the dimensions of the various parts shown in the drawings are not drawn according to the actual proportional relationship. In addition, the same or similar reference signs denote the same or similar components.

DETAILED DESCRIPTION

The exemplary embodiments of the present disclosure will be described in detail with reference to the accompanying drawings. The description of the exemplary embodiments is intended to be merely illustrative, and is not meant to be limitation on the present disclosure and its application or use in any way. The present disclosure may be implemented in many different forms, not limited to the embodiments described herein. These embodiments are provided so that this disclosure will be thorough and complete, and will fully convey the scope of the disclosure to those skilled in the art. It should be noted that, unless otherwise specified, relative arrangement of components and steps, ingredients of the materials, numerical expressions and numerical values set forth in these embodiments are to be construed as merely illustrative, not as a limitation.

The terms "first", "second" and similar words used in the present disclosure do not denote any order, quantity, or importance, but merely serve to distinguish different parts. Similar words like "include" or "comprise" mean that the element that precedes the word covers the elements listed after that term, but does not exclude the possibility of also covering other elements.

Unless otherwise specifically defined, all terms (including technical terms or scientific terms) used in the present disclosure have the same meanings as understood by an ordinary person skilled in the art to which the present disclosure belong. It will also be understood that terms defined in, for example, common dictionaries should be interpreted as having meanings that are consistent with their meanings in the context of the relevant art, and should not be interpreted in an idealized or extremely formal sense unless expressly defined here.

Techniques, methods, and devices known to an ordinary person skilled in the relevant art may not be discussed in detail but, where appropriate, such techniques, methods, and devices are to be considered part of the description.

The inventors have found through research that the incidence of a ESD (Electro-Static Discharge) is high in the process of manufacturing a IGZO-based TFT. For a first metal conductive wire and a second metal conductive wire formed on a same plane, the first metal conductive wire and the second metal conductive wire are closed to each other, so that the ESD phenomenon is easy to occur. The released charges can break down the insulating layers of the first metal conductive wire and the second metal conductive wire. Therefore, the first metal conductive wire or the second metal conductive wire may be electrically connected with other metal conductive wires on the adjacent plane, thereby causing short-circuiting to occur.

In the related art, the occurrence of the ESD phenomenon can be avoided by shortening the metal conductive wire or improving the electrostatic state of the device. However, the inventors of the present disclosure have found that the use of these methods does not provide an effective discharging path for the electrostatic discharging, and also increases the risk of the ESD phenomenon occurring again due to the continuous accumulation of the static electricity in the back end of the manufacturing process.

To this end, the present disclosure provides a scheme for providing an effective discharging path for ESD.

FIG. 1 is a schematic top view of a conductive wire structure according to one embodiment of the present disclosure.

As shown in FIG. 1, the conductive wire structure includes a first conductive wire 10, a second conductive wire 20, and an electrical connector 30. The first conductive wire 10 and the second conductive wire 20 are located on a first plane. A connection end 11 of the first conductive wire 10 is spaced apart from a connection end 21 of the second conductive wire 20 by a gap 40. The electrical connector 30 is connected to the connection end 11 of the first conductive wire 10 and the connection end 21 of the second conductive wire 20, respectively. A part of the electrical connector 30 is located on a second plane which is different from the first plane. Since the gap 40 is provided between the first conductive wire 10 and the second conductive wire 20, charges accumulated on the first conductive wire 10 and the second conductive wire 20 can be discharged through the gap 40.

In some embodiments, an insulating material may be disposed in the gap 40.

Figure 2:
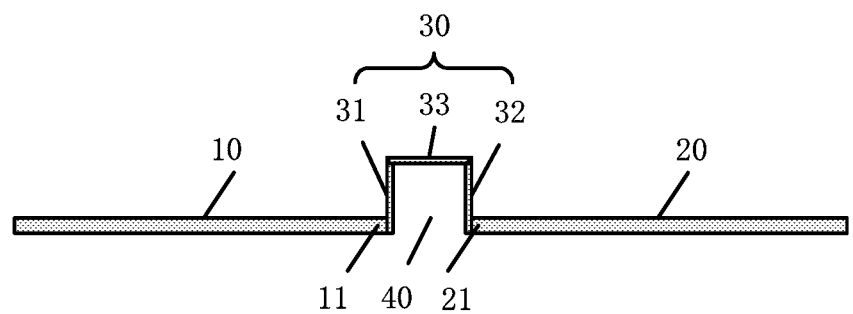
FIG. 2 is a schematic cross-sectional view of the embodiment shown in FIG. 1.

FIG. 2 is a schematic cross-sectional view of the embodiment shown in FIG. 1.

As shown in FIG. 2, the electrical connector 30 includes a first connection portion 31, a second connection portion 32, and a third connection portion 33. The first connection portion 31 is electrically connected to the connection end 11 of the first conductive wire 10. The first connection portion 32 is electrically connected to the connection end 21 of the second conductive wire 20. The third connecting portion 33 is electrically connected to the first connecting portion 31 and the second connecting portion 32, respectively. The first conductive wire 10 and the second conductive wire 20 are thus electrically connected by means of the electrical connector 30.

It should be noted that the first conductive wire 10 and the second conductive wire 20 are located on the first plane. The third connection portion 33 of the electrical connector 30 is located on a second plane different from the first plane. During the discharging of the charges accumulated on the first conductive wire 10 and the second conductive wire 20 through the gap 40, a insulating layer covering the connection end 11 of the first conductive wire 10 and a insulating layer covering the connection end 21 of the second conductive wire 20 will be broken down. A portion of the insulating layer which is broken down corresponds to the third connection portion 33 in the electrical connector 30. Therefore, the circumstance that the first conductive wire 10 and second conductive wire 20 are electrically connected with other metal conductive wires on the different plane because of the discharging of charges will not occur.

In some embodiments, a projection of an end face of the first conductive wire 10 on a plane on which an end face of the second conductive wire 20 is located at least partially covers the end face of the second conductive wire 20. For example, the projection of the end face of the first conductive wire 10 on a plane on which the end face of the second conductive wire 20 is located covers at least 85% of the end face of the second conductive wire 20. This ensures the efficiency of discharging the charge between the connection end 11 of the first conductive wire 10 and the connection end 21 of the second conductive wire 20.

In some embodiments, a width of the gap 40 between the connection end 11 of the first conductive wire 10 and the connection end 21 of the second conductive wire 20 is 5 to 10 μm. In this range, the charges accumulated on the first conductive wire 10 and the second conductive wire 20 can be effectively discharged through the gap 40.

In some embodiments, line widths of the first conductive wire 10 and the second conductive wire 20 are 5 to 10 μm. The first and second conductive wires 10 and 20 may be gate wires, or metal wires for other purposes.

For example, a long gate wire may be divided into a first gate wire and a second gate wire that are opposite to each other, and a gap is formed between the first gate wire and the second gate wire. The first gate wire and the second gate wire are connected by an electrical connector. The gap between the first and second gate wires is used as a path for electrostatic discharging.

In the conductive wire structure provided in the above-described embodiment of the present disclosure, by providing a gap between the first conductive wire and the second conductive wire which are electrically connected, the charges accumulated on the first conductive wire and the second conductive wire are discharged through the gap. Therefore, the influence on the device caused by charge release can be effectively avoided, and the product yield is effectively improved.

The present disclosure also provides an array substrate, which may include the conductive wire structure provided in any of the embodiments of FIG. 1 or FIG. 2.

Figure 3:
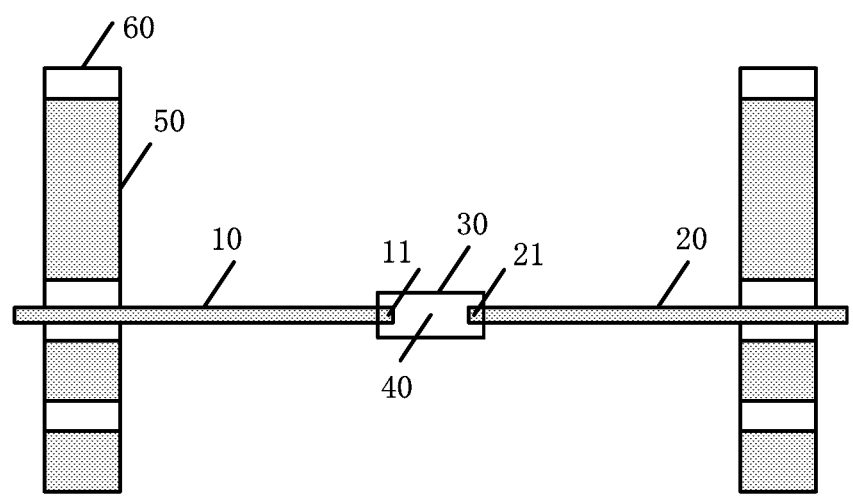
FIG. 3 is a schematic top view of an array substrate according to one embodiment of the present disclosure.

FIG. 3 is a schematic top view of an array substrate according to one embodiment of the present disclosure.

As shown in FIG. 3, in order to further avoid the influence of the electrostatic discharging on the device, the gap between the first conductive wire 10 and the second conductive wire 20 is provided in the display area. Therefore, the influence of electrostatic discharging to other peripheral metal wires such as the public metal conductive wire can be effectively avoided.

As shown in FIG. 3, the conductive wire 50 is a metal wire on a same plane as the first conductive wire 10 and the second conductive wire 20. The conductive wire 60 is a metal wire on a different plane as the first conductive wire 10 and the second conductive wire 20.

The present disclosure also provides a display device, which may include the array substrate provided in any of the embodiments of FIG. 3. The display device can be any product or component with display function such as a display, a mobile phone, a tablet computer, a television, a notebook computer, a digital photo frame, a navigator and the like.

Figure 4:
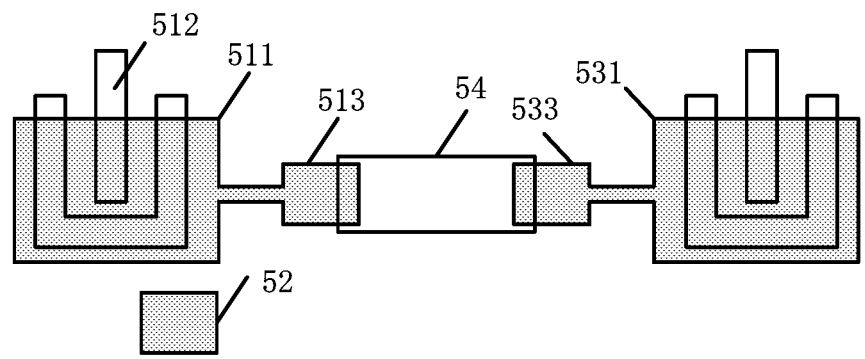
FIG. 4 is a schematic top view of a gate shift register according to one embodiment of the present disclosure.

FIG. 4 is a schematic top view of a gate shift register according to one embodiment of the present disclosure.

The inventors have noted that the gate shift register region is also susceptible to the occurrence of ESD phenomenon. As shown in FIG. 4, when the distance between a first gate 511 and a gate jumper 52 of a third gate is short, an electrostatic discharging is occurred in a gap between the gate 511 and the gate jumper 52, thereby causing a breakdown of the gate insulating layer, so that the gate 511 is electrically connected to the corresponding source or drain 512, resulting in a problem of poor split-screen driving.

It should be noted that the gate jumper 513 of the first gate 511 and a gate jumper 533 of a second gate 531 are electrically connected by a jumper 54.

Figure 5:
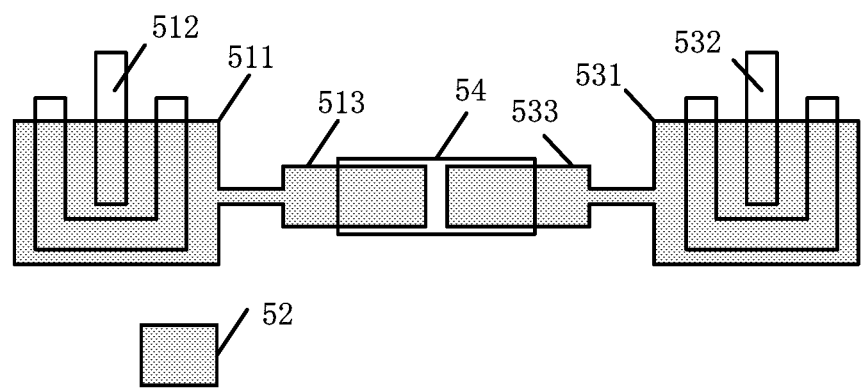
FIG. 5 is a schematic top view of a gate shift register according to another embodiment of the present disclosure.

FIG. 5 is a schematic top view of a gate shift register according to another embodiment of the present disclosure.

As shown in FIG. 5, the gate jumper 513 of the first gate 511 and the gate jumper 533 of the second gate 531 are elongated and closed to each other, and the facing distance between the gate jumper 513 and the gate jumper 533 is controlled to be between 5 and 10 μm. Further, the distance between the gate jumper 52 of the third gate and the first gate 511 is increased. It should be noted that the gate jumper 513, the gate jumper 533, the gate jumper 52, the first gate 511, the second gate 531 and the third gate are located on a same plane. Thus, after the charge is accumulated to some extent, the electrostatic discharging will occur between the gate jumper 513 and the gate jumper 533 firstly. It is ensured that the source or drain 512 will not short-circuited with the lower metal layer during deposition, and a source or drain 532 will not short-circuit with the lower metal layer during deposition, thereby avoiding the problem of poor display.

Figure 6:
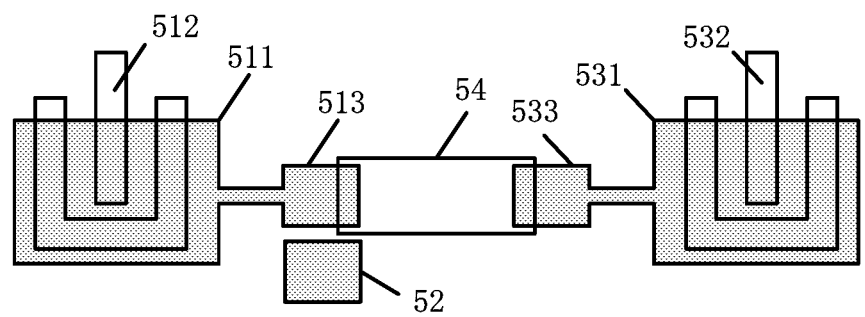
FIG. 6 is a schematic top view of a gate shift register according to still another embodiment of the present disclosure.

FIG. 6 is a schematic top view of a gate shift register according to still another embodiment of the present disclosure.

As shown in FIG. 6, the gate jumper 52 may also be moved to a position directly opposite to the gate jumper 513 of the first gate 511. The facing distance between the gate jumper 513 and the gate jumper 52 is controlled to be between 5 and 10 μm. After the charge is accumulated to some extent, it is discharged between the gate jumper 513 and the gate jumper 52. Although the discharging of the charges damages the insulating layer on the gate jumper 513 and the gate jumper 52, the electrostatic discharging position corresponds to the jumper crossing position, therefore the display is not adversely affected.

FIG. 7 is a flow chart illustrating a method for fabricating a conductive wire structure according to one embodiment of the present disclosure.

In step 701, a first conductive wire and a second conductive wire are formed on a first plane, wherein a connection end of the first conductive wire is spaced apart from a connection end of the second conductive wire by a gap so as to discharge charges accumulated on the first and second conductive wires through the gap.

In some embodiments, a projection of an end face of the first conductive wire on a plane on which an end face of the second conductive wire is located at least partially covers the end face of the second conductive wire. This ensures the efficiency of discharging the charge between the connection end of the first conductive wire and the connection end of the second conductive wire.

In some embodiments, the width of the gap between the connection end of the first conductive wire and the connection end of the second conductive wire is 5 to 10 μm. In this range, the charges accumulated on the first conductive wire and the second conductive wire can be effectively discharged through the gap.

In some embodiments, the line widths of the first conductive wire and the second conductive wire are 5 to 10 μm. The first and second conductive wires may be gate wires, or metal wires for other purposes.

In step 702, an electrical connector is formed, wherein the electrical connector is respectively connected to the connection end of the first conductive wire and the connection end of the second conductive wire. A part of the electrical connector is located on a second plane different from the first plane.

In method of fabricating the conductive wire structure provided in the aforementioned embodiment of the present disclosure, by providing a gap between the first conductive wire and the second conductive wire which are electrically connected, the charges accumulated on the first conductive wire and the second conductive wire are discharged through the gap. Therefore, the influence on the device caused by charge release can be effectively avoided, and the product yield is effectively improved.

Figure 8C:
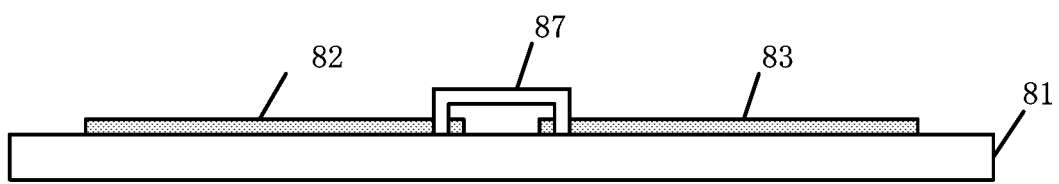

FIGS. 8A-8C are cross-sectional views of a structure at several stages in a method of fabricating a conductive wire structure according to some embodiments of the present disclosure.

First, as shown in FIG. 8A, a first conductive wire 82 and a second conductive wire 83 are formed on the substrate 81. There is a gap 84 between the first conductive wire 82 and the second conductive wire 83. The gap 84 is used for releasing the charges accumulated on the first conductive wire 82 and the second conductive wire 83.

In some embodiments, a width of the gap between the first and second conductive wires is 5 to 10 μm.

In some embodiments, line widths of the first conductive wire and the second conductive wire are 5 to 10 μm.

In some embodiments, a projection of an end face of the first conductive wire on a plane on which an end face of the second conductive wire is located at least partially covers the end face of the second conductive wire. For example, the projection of the end face of the first conductive wire on a plane on which the end face of the second conductive wire is located covers at least 85% of the end face of the second conductive wire. This ensures the efficiency of discharging the charge between the connection end of the first conductive wire and the connection end of the second conductive wire.

Next, as shown in FIG. 8B, a first via hole 85 is formed at the connection end of the first conductive wire 82, and a second via hole 86 is formed at the connection end of the second conductive wire 83.

Next, as shown in FIG. 8C, an electrical connector 87 is provided through the first via hole 85 and the second via hole 86. The first conductive wire 82 and the second conductive wire 83 are thus electrically connected by means of the electrical connector 87.

Up to this point, the embodiments of the present disclosure have been described in detail. In order to avoid obscuring the concepts of the present disclosure, some details known in the art are not described. Those skilled in the art can totally understand how to implement the technical solution disclosed here according to the above description.

Although some specified embodiments of the present disclosure have been explained in detail by the examples, those skilled in the art shall understand that the above examples are only intended for making explanation rather than for limiting the scope of the present disclosure. Those skilled in the art shall understand that the above embodiments can be amended or equivalent substitute of part of the technical features can be performed without deviating from the scope and spirit of the present disclosure. The scope of the present disclosure is defined by the following claims.

What is claimed is:

1. An array substrate, comprising:
a first conductive wire, a second conductive wire, a third conductive wire, a first gate, a second gate and a third gate on a first plane, wherein a first connection end of the first conductive wire is electrically connected with the first gate, a first connection end of the second conductive wire is electrically connected with the second gate, the third conductive wire is electrically connected with the third gate, the third conductive wire is not electrically connected with the first conductive wire and the second conductive wire, a second connection end of the first conductive wire is spaced apart from a second connection end of the second conductive wire by a gap, the first conductive wire and the second conductive wire to discharge accumulated charges through the gap, a width of the gap is smaller than a distance between the third conductive wire and the first gate or a distance between the third conductive wire and the second gate; and
an electrical connector connected to the second connection end of the first conductive wire and the second connection end of the second conductive wire, respectively, wherein a part of the electrical connector is located on a second plane different from the first plane.

2. The array substrate according to claim 1, wherein a projection of an end face of the first conductive wire on a plane where an end face of the second conductive wire is located at least partially covers the end face of the second conductive wire.

3. The array substrate according to claim 1, wherein a width of the gap is 5 to 10 μm.

4. The array substrate according to claim 1, wherein line widths of the first conductive wire and the second conductive wire are 5 to 10 μm.

5. The array substrate according to claim 1, wherein the electrical connector comprises:
a first connection portion, electrically connected with the second connection end of the first conductive wire;
a second connection portion, electrically connected with the second connection end of the second conductive wire; and
a third connection portion, electrically connected to the first connection portion and the second connection portion, respectively.

6. The array substrate according to claim 5, wherein the third connection portion is located on the second plane.

7. The array substrate according to claim 1, wherein the gap is located in a display area.

8. A display device comprising the array substrate according to claim 1.

9. A manufacturing method of a conductive wire structure, comprising:
forming a first conductive wire, a second conductive wire, a third conductive wire, a first gate, a second gate and a third gate on a first plane, wherein a first connection end of the first conductive wire is electrically connected with the first gate, a first connection end of the second conductive wire is electrically connected with the second gate, the third conductive wire is electrically connected with the third gate, the third conductive wire is not electrically connected with the first conductive wire and the second conductive wire, a second connection end of the first conductive wire is spaced apart from a second connection end of the second conductive wire by a gap, the first conductive wire and the second conductive wire to discharge accumulated charges through the gap, a width of the gap is smaller than a distance between the third conductive wire and the first gate or a distance between the third conductive wire and the second gate; and
forming an electrical connector connected to the second connection end of the first conductive wire and the second connection end of the second conductive wire, respectively, wherein a part of the electrical connector is located on a second plane different from the first plane.

10. The manufacturing method according to claim 9, wherein
   a projection of an end face of the first conductive wire on a plane where an end face of the second conductive wire is located at least partially covers the end face of the second conductive wire.

11. The manufacturing method according to claim 10, wherein
   a width of the gap is 5 to 10 μm.

12. The manufacturing method according to claim 10, wherein
   line widths of the first conductive wire and the second conductive wire are 5 to 10 μm.

* * * * *